(12) United States Patent
Kim (10) Patent No.: US 9,741,767 B2
(45) Date of Patent: Aug. 22, 2017

(54) ELECTRONIC DEVICE

(71) Applicant: SK hynix Inc., Icheon (KR)

(72) Inventor: Kyung-Wan Kim, Icheon-si (KR)

(73) Assignee: SK HYNIX INC., Icheon (KR)

( * ) Notice: Subject to any disclaimer, the term of this patent is extended or adjusted under 35 U.S.C. 154(b) by 162 days.

(21) Appl. No.: 14/925,254

(22) Filed: Oct. 28, 2015

(65) Prior Publication Data

US 2016/0365384 A1 Dec. 15, 2016

(30) Foreign Application Priority Data

Jun. 10, 2015 (KR) ........................ 10-2015-0081735

(51) Int. Cl.
| | |
|---|---|
| H01L 29/792 | (2006.01) |
| H01L 27/24 | (2006.01) |
| H01L 45/00 | (2006.01) |
| H01L 43/02 | (2006.01) |
| H01L 43/08 | (2006.01) |

(Continued)

(52) U.S. Cl.
CPC .......... *H01L 27/249* (2013.01); *G06F 3/0604* (2013.01); *G06F 3/0656* (2013.01); *G06F 3/0679* (2013.01); *G06F 12/0802* (2013.01); *G06F 13/1673* (2013.01); *H01L 27/11514* (2013.01); *H01L 27/222* (2013.01); *H01L 43/02* (2013.01); *H01L 43/08* (2013.01); *H01L 45/1226* (2013.01); *H01L 45/1253* (2013.01); *H01L 45/141* (2013.01); *H01L 45/146* (2013.01); *H01L 45/147* (2013.01); *G06F 2212/2024* (2013.01); *G06F 2212/60* (2013.01); *H01L 27/11597* (2013.01)

(58) Field of Classification Search
CPC . H01L 27/249; H01L 45/1226; H01L 45/146; H01L 45/147; H01L 45/141; H01L 43/02; H01L 43/08; H01L 27/222; H01L 27/11514; H01L 45/1253; H01L 27/11597; G06F 13/1673; G06F 3/0604; G06F 3/0656; G06F 3/0679; G06F 12/0802; G06F 2212/60; G06F 2212/2024
See application file for complete search history.

(56) References Cited

U.S. PATENT DOCUMENTS

| 8,796,662 B2 * | 8/2014 | Song | ................ | H01L 27/249 |
| | | | | 257/4 |
| 2012/0119180 A1 * | 5/2012 | Koo | ................ | H01L 27/101 |
| | | | | 257/2 |

(Continued)

FOREIGN PATENT DOCUMENTS

| KR | 10-2012-0050173 A | 5/2012 |
| KR | 10-1207790 B1 | 12/2012 |
| KR | 10-2014-0127617 A | 11/2014 |

*Primary Examiner* — Victor A Mandala (57) ABSTRACT

Provided is an electronic device including a semiconductor memory. The semiconductor memory may include: a vertical electrode formed over a substrate; a plurality of first memory elements and a plurality of first interlayer dielectric layers alternately stacked along a first side surface of the vertical electrode; and a plurality of second memory elements and a plurality of second interlayer dielectric layers alternately stacked along a second side surface of the vertical electrode, and the plurality of first memory elements correspond to the plurality of second interlayer dielectric layers, respectively, in the vertical direction.

18 Claims, 5 Drawing Sheets

(51) Int. Cl.
*H01L 27/22* (2006.01)
*H01L 27/11514* (2017.01)
*G06F 3/06* (2006.01)
*G06F 12/0802* (2016.01)
*G06F 13/16* (2006.01)
*H01L 27/11597* (2017.01)

(56) References Cited

U.S. PATENT DOCUMENTS

| | | | | |
|---|---|---|---|---|
| 2013/0105876 A1* | 5/2013 | Hwang | ............... | H01L 27/249 257/314 |
| 2013/0200331 A1* | 8/2013 | Morikawa | ........... | H01L 45/1608 257/5 |
| 2013/0285006 A1* | 10/2013 | Park | ................ | H01L 45/1206 257/5 |
| 2014/0077143 A1* | 3/2014 | Seong | ................. | H01L 45/12 257/2 |
| 2014/0103283 A1* | 4/2014 | Park | ................ | H01L 45/08 257/4 |
| 2014/0145137 A1* | 5/2014 | Ju | .................... | H01L 45/08 257/2 |
| 2015/0132944 A1* | 5/2015 | Park | ................ | H01L 45/1658 438/635 |
| 2015/0162383 A1* | 6/2015 | Hwang | ............... | H01L 45/08 257/4 |

\* cited by examiner

ELECTRONIC DEVICE

CROSS-REFERENCE TO RELATED APPLICATIONS

The present application claims priority of Korean Patent Application No. 10-2015-0081735, entitled "ELECTRONIC DEVICE" and filed on Jun. 10, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of improving the characteristics of a variable resistance element.

In an implementation, there is provided an electronic device including a semiconductor memory. The semiconductor memory may include: a vertical electrode formed over a substrate; a plurality of first memory elements and a plurality of first interlayer dielectric layers alternately stacked along a first side surface of the vertical electrode; and a plurality of second memory elements and a plurality of second interlayer dielectric layers alternately stacked along a second side surface of the vertical electrode, and the plurality of first memory elements correspond to the plurality of second interlayer dielectric layers, respectively, in the vertical direction.

The plurality of first memory elements have the same thickness as the corresponding second interlayer dielectric layers. The plurality of first memory elements have a larger thickness than the corresponding second interlayer dielectric layers. Each of the first and second memory elements comprises a first electrode, a variable resistance layer, and a second electrode, which are horizontally arranged. Any one of the first and second electrodes is in contact with the vertical electrode, and has a structure surrounded by the variable resistance layer. The variable resistance layer comprises a single-layer or multilayer structure. The variable resistance layer comprises a transition metal oxide, a metal oxide including a perovskite-based material, a phase change material including a chalcogenide-based material, a ferrodielectric material, and a ferromagnetic material. The vertical electrode and the first and second electrodes comprise any one transition metal or nitride selected from the group consisting of TiN, Pt, W, TaN, Ir, Ni, Cu, Ta, Ti, Hf, and Zr.

The electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

DETAILED DESCRIPTION

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1:
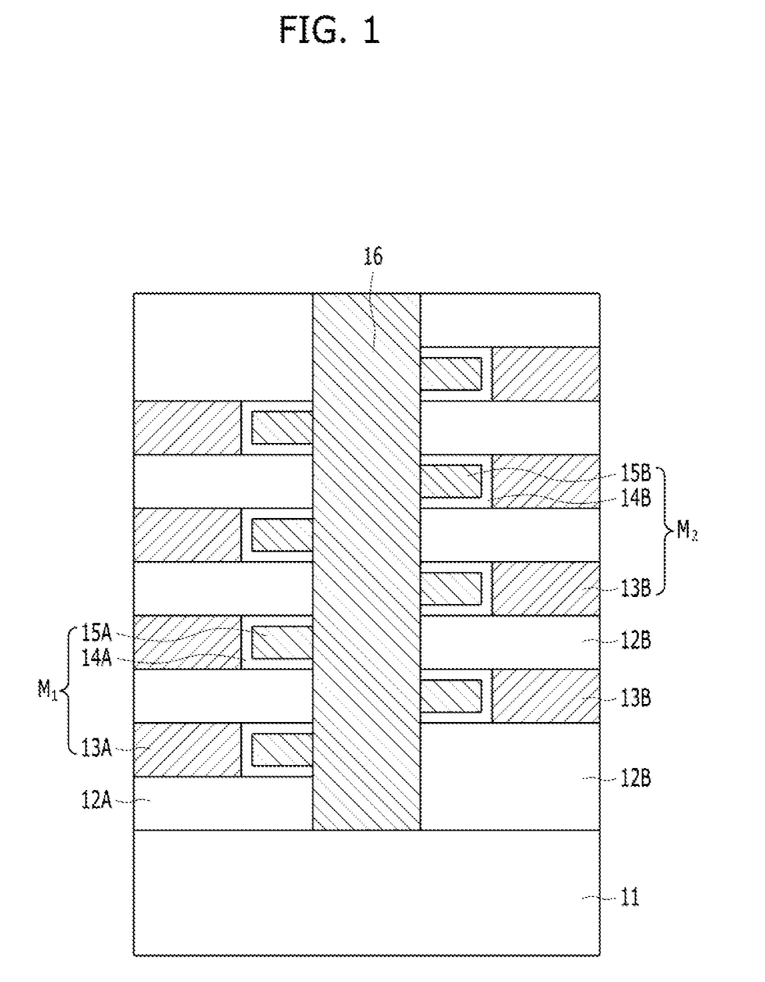
FIG. 1 is a cross-sectional view of a semiconductor device in accordance with an implementation.

FIG. 1 is a cross-sectional view of a semiconductor device in accordance with an implementation.

As illustrated in FIG. 1, a vertical electrode 16 may be disposed over a substrate 11. Along a first side surface of the vertical electrode 16, a plurality of first memory elements M1 and a plurality of first interlayer dielectric layers 12A may be alternately stacked. Along a second side surface of the vertical electrode 16, a plurality of second memory elements M2 and a plurality of second interlayer dielectric layers 12B may be alternately stacked.

The plurality of first memory elements M1 may be disposed to correspond to the respective second interlayer dielectric layers 12B in a vertical direction perpendicular to a top surface of the substrate 11. In an implementation, a side surface of a first memory element M1 is parallel and opposite to a side surface of a corresponding second interlayer dielectric layer 12B with respect to the vertical electrode 16. That is, the plurality of first memory elements M1 disposed along the first side surface of the vertical electrode 16 and the plurality of second memory elements M2 disposed along the second side surface of the vertical electrode 16 may be alternately arranged, such that adjacent first and second memory elements M1 and M2 have a level difference from each other in the vertical direction. In an implementation, bottom surfaces of the adjacent first and second memory elements M1 and M2 are spaced apart from the top surface of the substrate 11 by different distances.

Furthermore, an uppermost layer of the stack structure in which the first and second memory elements M1 and M2 and the first and second interlayer dielectric layers 12A and 12B are stacked may include corresponding first and second interlayer dielectric layers 12A and 12B.

The first and second interlayer dielectric layers 12A and 12B may include various insulating materials such as oxide and nitride.

The first and second memory elements M1 and M2 may store data using a variable resistance characteristic of switching between different resistance states according to an applied voltage or current. Each of the first and second memory elements M1 and M2 may include two electrodes for applying a voltage or current and a variable resistance material interposed between the two electrodes. In an implementation, each of the first and second memory elements M1 and M2 may include a first electrode 13A or 13B, a variable resistance layer 14A or 14B, and a second electrode 15A or 15B, which are arranged in a horizontal direction parallel to the top surface of the substrate 11. In an implementation, the second electrode 15A or 15B may be in contact with a corresponding portion of the first or second side surface of the vertical electrode 16. Furthermore, the second electrode 15A or 15B may include a portion surrounded by the variable resistance layer 14A or 14B, respectively. FIG. 1 illustrates that each of the second electrodes 15A and 15B has one side being in contact with a corresponding portion of the first and second side surfaces of the vertical electrode 16, and has other sides being surrounded by a corresponding one of the variable resistance layers 14A and 14B. However, implementations of the present disclosure are not limited thereto.

FIG. 1 illustrates that the second electrodes 15A and 15B are formed separately from the vertical electrode 16. However, implementations of the present disclosure are not limited thereto. In an implementation, after the variable resistance layers 14A and 14B have been formed, the second electrodes 15A and 15B and the vertical electrode 16 may be formed simultaneously through the same process.

The first electrodes 13A and 13B, the second electrodes 15A and 15B, and the vertical electrode 16 may include a conductive material. The conductive material may include at least one member of transition metal and nitride, e.g., at least one selected from the group consisting of TiN, Pt, W, TaN, Ir, Ni, Cu, Ta, Ti, Hf, and Zr.

The variable resistance layers 14A and 14B may include a material which switches between different resistance states, according to a voltage or current applied across the variable resistance layers 14A and 14B. For example, the variable resistance layers 14A and 14B may include any of various materials used for RRAM, PRAM, FRAM, MRAM and the like. For example, the various materials may include a transition metal nitride, a transition metal oxide, a metal oxide such as a perovskite-based material, a phase change material such as a chalcogenide-based material, a ferrodielectric material, and a ferromagnetic material. The variable resistance layers 14A and 14B may have a single-layer structure or a multilayer structure which includes two or more layers to exhibit a variable resistance characteristic.

In the implementation shown in FIG. 1, the first and second memory elements M1 and M2 being in contact with the respective side surfaces of the vertical electrode 16 may be asymmetrically arranged with respect to the vertical electrode 16 such that adjacent first and second memory elements M1 and M2 do not face each other, thereby reducing a coupling or disturbance issue between the adjacent memory elements M1 and M2.

Furthermore, the first memory elements M1 may have substantially the same thickness as corresponding second interlayer dielectric layers 12B, and the second memory elements M2 may have substantially the same thickness as corresponding first interlayer dielectric layers 12A, as illustrated in FIG. 1. However, implementations of the present disclosure are not limited thereto. In an implementation, the first and second memory elements M1 and M2 may have a larger thickness than that of the corresponding second and first interlayer dielectric layers 12B and 12A, respectively. In this implementation, because the first and second interlayer dielectric layers 12A and 12B have a thickness smaller than that in the implementation shown in FIG. 1, the vertical electrode 16 may have a smaller critical dimension (CD) than that in the implementation shown in FIG. 1. As the thickness of the first and second memory elements M1 and M2 is increased, a gap-fill margin associated with the process of forming the first and second memory elements M1 and M2 may be further secured.

In accordance with the implementations, an electronic device including the semiconductor device can improve the characteristic of the variable resistance element.

The above and other memory circuits or semiconductor devices based on the disclosed technology can be used in a range of devices or systems. FIGS. 2-6 provide some examples of devices or systems that can implement the memory circuits disclosed herein.

Figure 2:
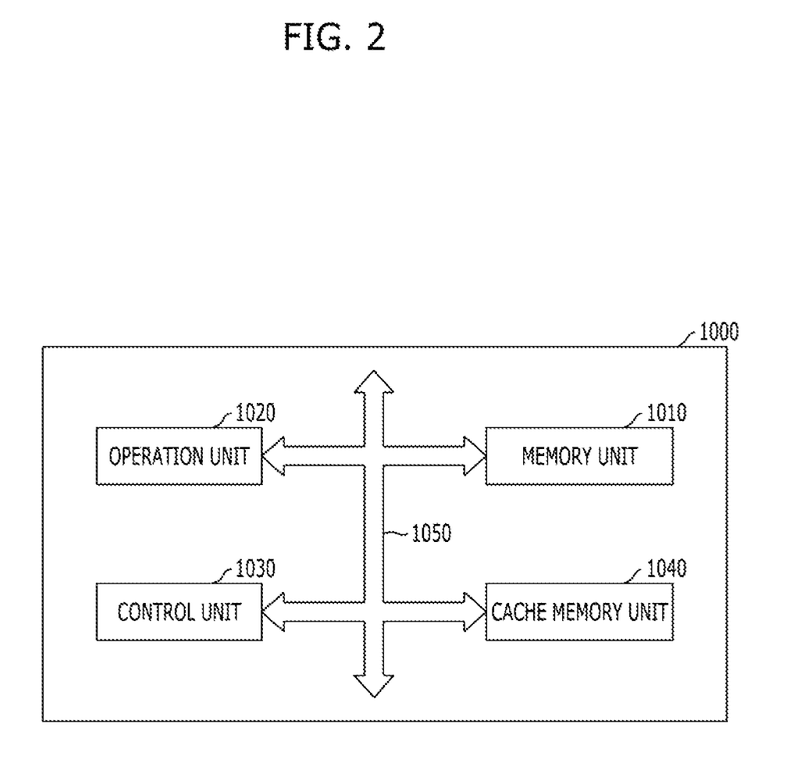
FIG. 2 is an example of configuration diagram of a microprocessor implementing memory circuitry based on the disclosed technology.

FIG. 2 is an example of configuration diagram of a microprocessor implementing memory circuitry based on the disclosed technology.

Referring to FIG. 2, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a vertical electrode formed over a substrate; a plurality of first memory elements and a plurality of first interlayer dielectric layers alternately stacked along a first side surface of the vertical electrode; and a plurality of second memory elements and a plurality of second interlayer dielectric layers alternately stacked along a second side surface of the vertical electrode, and the plurality of first memory elements correspond to the plurality of second interlayer dielectric layers, respectively, in the vertical direction. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 3:
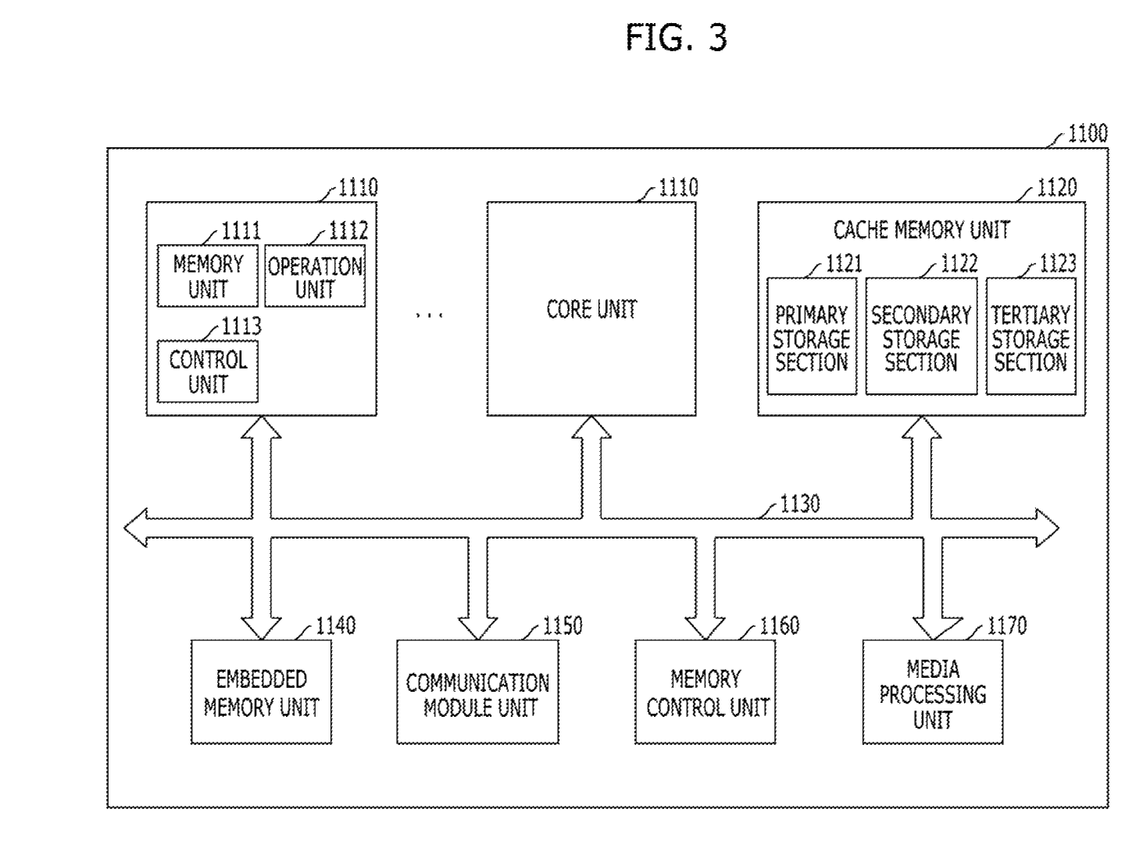
FIG. 3 is an example of configuration diagram of a processor implementing memory circuitry based on the disclosed technology.

FIG. 3 is an example of configuration diagram of a processor implementing memory circuitry based on the disclosed technology.

Referring to FIG. 3, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a vertical electrode formed over a substrate; a plurality of first memory elements and a plurality of first interlayer dielectric layers alternately stacked along a first side surface of the vertical electrode; and a plurality of second memory elements and a plurality of second interlayer dielectric layers alternately stacked along a second side surface of the vertical electrode, and the plurality of first memory elements correspond to the plurality of second interlayer dielectric layers, respectively, in the vertical direction. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 3 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 4:
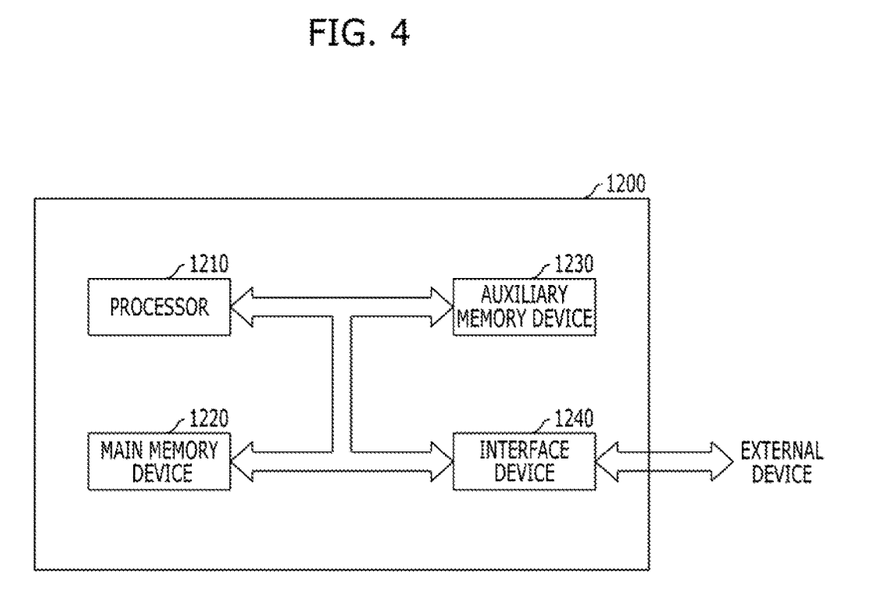
FIG. 4 is an example of configuration diagram of a system implementing memory circuitry based on the disclosed technology.

FIG. 4 is an example of configuration diagram of a system implementing memory circuitry based on the disclosed technology.

Referring to FIG. 4, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a vertical electrode formed over a substrate; a plurality of first memory elements and a plurality of first interlayer dielectric layers alternately stacked along a first side surface of the vertical electrode; and a plurality of second memory elements and a plurality of second interlayer dielectric layers alternately stacked along a second side surface of the vertical electrode, and the plurality of first memory elements correspond to the plurality of second interlayer dielectric layers, respectively, in the vertical direction. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a vertical electrode formed over a substrate; a plurality of first memory elements and a plurality of first interlayer dielectric layers alternately stacked along a first side surface of the vertical electrode; and a plurality of second memory elements and a plurality of second interlayer dielectric layers alternately stacked along a second side surface of the vertical electrode, and the plurality of first memory elements correspond to the plurality of second interlayer dielectric layers, respectively, in the vertical direction. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 5) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 5) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 5:
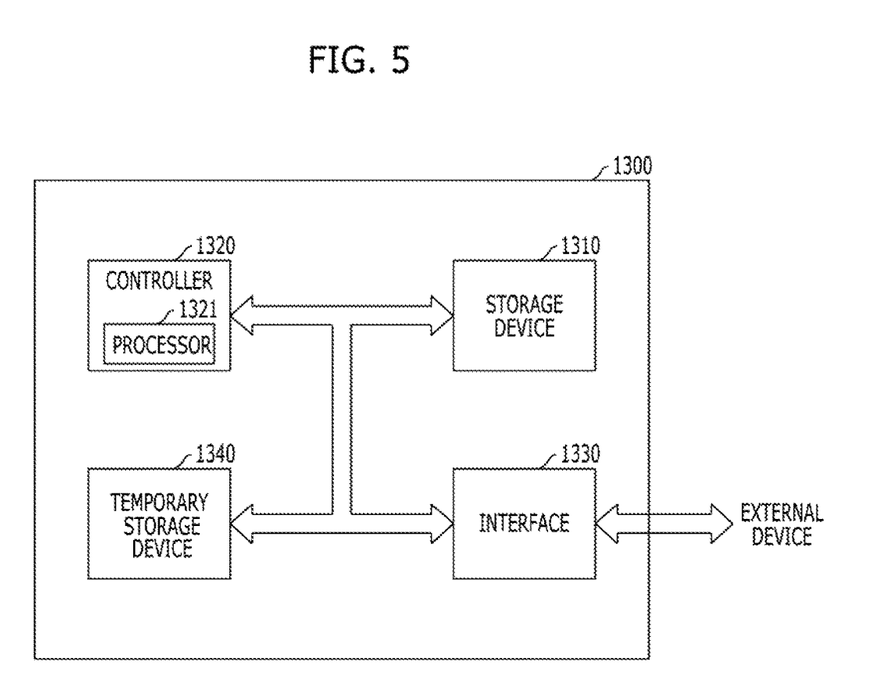
FIG. 5 is an example of configuration diagram of a data storage system implementing memory circuitry based on the disclosed technology.

FIG. 5 is an example of configuration diagram of a data storage system implementing memory circuitry based on the disclosed technology.

Referring to FIG. 5, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a vertical electrode formed over a substrate; a plurality of first memory elements and a plurality of first interlayer dielectric layers alternately stacked along a first side surface of the vertical electrode; and a plurality of second memory elements and a plurality of second interlayer dielectric layers alternately stacked along a second side surface of the vertical electrode, and the plurality of first memory elements correspond to the plurality of second interlayer dielectric layers, respectively, in the vertical direction. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 6:
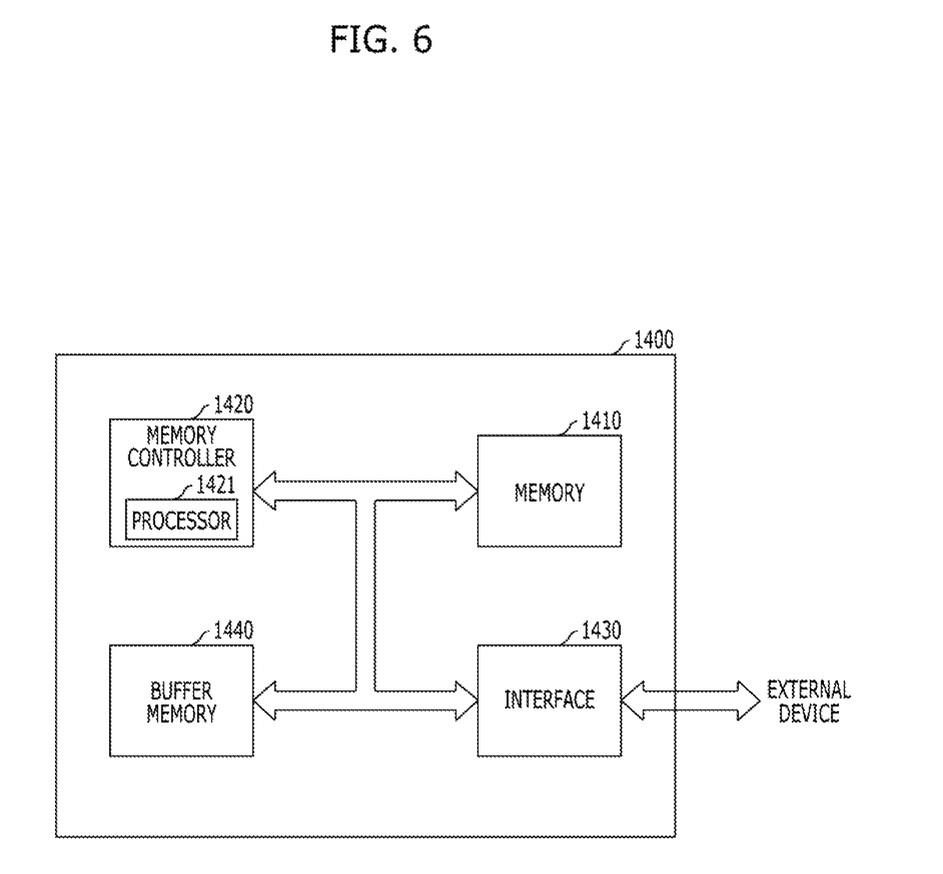
FIG. 6 is an example of configuration diagram of a memory system implementing memory circuitry based on the disclosed technology.

FIG. 6 is an example of configuration diagram of a memory system implementing memory circuitry based on the disclosed technology.

Referring to FIG. 6, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a vertical electrode formed over a substrate; a plurality of first memory elements and a plurality of first interlayer dielectric layers alternately stacked along a first side surface of the vertical electrode; and a plurality of second memory elements and a plurality of second interlayer dielectric layers alternately stacked along a second side surface of the vertical electrode, and the plurality of first memory elements correspond to the plurality of second interlayer dielectric layers, respectively, in the vertical direction. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a vertical electrode formed over a substrate; a plurality of first memory elements and a plurality of first interlayer dielectric layers alternately stacked along a first side surface of the vertical electrode; and a plurality of second memory elements and a plurality of second interlayer dielectric layers alternately stacked along a second side surface of the vertical electrode, and the plurality of first memory elements correspond to the plurality of second interlayer dielectric layers, respectively, in the vertical direction. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 2-6 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    a vertical electrode disposed over a substrate and extending in a first direction;
    a plurality of first memory elements and a plurality of first interlayer dielectric layers, wherein a first memory element and a first interlayer dielectric layer are alternately stacked along a first side surface of the vertical electrode; and
    a plurality of second memory elements and a plurality of second interlayer dielectric layers, wherein a second memory element and a second interlayer dielectric layer are alternately stacked along a second side surface of the vertical electrode,
    wherein the plurality of first memory elements are disposed to correspond to the plurality of second interlayer dielectric layers, respectively, in a second direction with respect to the vertical electrode, the second direction being perpendicular to the first direction.

2. The electronic device of claim 1, wherein the plurality of first memory elements have substantially the same thickness as that of the corresponding second interlayer dielectric layers.

3. The electronic device of claim 1, wherein the plurality of first memory elements have a thickness greater than that of the corresponding second interlayer dielectric layers.

4. The electronic device of claim 1, wherein each of the first and second memory elements comprises a first electrode, a variable resistance layer, and a second electrode, which are arranged in the second direction.

5. The electronic device of claim 4, wherein any one of the first and second electrodes is in contact with the vertical electrode, and has a portion surrounded by the variable resistance layer.

6. The electronic device of claim 4, wherein the variable resistance layer has a single-layer or multilayer structure.

7. The electronic device of claim 4, wherein the variable resistance layer comprises a transition metal oxide, a metal oxide including a perovskite-based material, a phase change material including a chalcogenide-based material, a ferrodielectric material, a ferromagnetic material, or a combination thereof.

8. The electronic device of claim 4, wherein the vertical electrode and the first and second electrodes comprise one or more members of transition metal and nitride, which are selected from the group consisting of TiN, Pt, W, TaN, Ir, Ni, Cu, Ta, Ti, Hf, and Zr.

9. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit that includes the resistance variable element is part of the memory unit in the microprocessor.

10. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the resistance variable element is part of the cache memory unit in the processor.

11. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit that includes the resistance variable element is part of the auxiliary memory device or the main memory device in the processing system.

12. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the resistance variable element is part of the storage device or the temporary storage device in the data storage system.

13. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit that includes the resistance variable element is part of the memory or the buffer memory in the memory system.

14. The electronic device according to claim 1, wherein side surfaces of the plurality of first memory elements are parallel and opposite to corresponding side surfaces of the plurality of second memory elements, respectively, with respect to the vertical electrode.

15. The electronic device according to claim 1, wherein the first direction is perpendicular to a top surface of the substrate.

16. The electronic device according to claim 1, wherein a top surface of each of the plurality of first memory elements is substantially coplanar with a bottom surface of a corresponding one of the plurality of second memory elements.

17. The electronic device according to claim 1, wherein the plurality of first memory elements and the plurality of second memory elements are arranged asymmetrically with respect to a center line of the vertical electrode, the center line extending in the first direction.

18. The electronic device of claim 5, wherein the any one of the first and second electrodes has one side being in contact with the vertical electrode and the other sides being surrounded by the variable resistance layer.

* * * * *